United States Patent

Burns

[11] Patent Number: 5,825,786
[45] Date of Patent: Oct. 20, 1998

[54] UNDERSAMPLING DIGITAL TESTABILITY CIRCUIT

[75] Inventor: Mark Burns, Garland, Tex.

[73] Assignee: Texas Instruments Incorporated, Dallas, Tex.

[21] Appl. No.: 96,149

[22] Filed: Jul. 22, 1993

[51] Int. Cl.⁶ .................................................. G06F 11/00
[52] U.S. Cl. ...................................... 371/167.1; 371/20.1
[58] Field of Search ................................ 371/15.1, 3, 5.1, 371/6, 20.1, 20.4, 48, 67.1; 341/61, 132, 144, 158; 358/10; 395/131, 153, 183.01, 183.15, 183.19, 185.01; 345/213, 199

[56] References Cited

U.S. PATENT DOCUMENTS

| | | | |
|---|---|---|---|
| 5,196,834 | 3/1993 | Edelson et al. | 345/199 |
| 5,277,863 | 1/1994 | Bilbrey et al. | 395/153 |
| 5,287,100 | 2/1994 | Guttag et al. | 345/213 |
| 5,293,468 | 3/1994 | Nye et al. | 395/131 |
| 5,309,551 | 5/1994 | Guttag et al. | 395/131 |

FOREIGN PATENT DOCUMENTS 0 202 865 A2   5/1986   European Pat. Off. ........ G06F 11/26

OTHER PUBLICATIONS

Chasters A 1–Micron CMOS 128 MHZ video serialiser Palette, and Digital to Analogue (DAC) chip IEEE 1989 p. 117.

Primary Examiner—Albert Decady
Attorney, Agent, or Firm—Ronald O. Neerings; James C. Kesterson; Richard L. Donaldson

[57] ABSTRACT

An undersampling digital testability circuit 20 includes a bus 15, a data capture array 22 and a divider circuit 18. Divider circuit 18 provides an enablement signal to data capture array 22 that undersamples data travelling along the bus 15 at high data rates thereby effectively testing the integrity of high data rate transfers without the disadvantages of prior art test methodologies.

5 Claims, 2 Drawing Sheets ial-to-analog converter">
UNDERSAMPLING DIGITAL TESTABILITY CIRCUIT

FIELD OF THE INVENTION

This invention relates to electronic circuits and more particularly relates to sampling circuits for circuit testing.

BACKGROUND OF THE INVENTION

In integrated circuits, circuit performance is verified through functional and parametric testing. For example, a series of voltage values are placed on circuit inputs and the outputs are examined to see whether the circuit is functioning appropriately. Additionally, supply currents, signal transition times and other characteristics are measured to ensure each circuit meets the parametric specifications required by the customer. As circuits become faster, test mechanisms must become more creative to ensure that high speed data transfers are error free.

FIG. 1 is a prior art diagram illustrating a portion of a video driver circuit 10. Video driver circuit 10 consists of a data source 12, typically pixel data, a bus 13, a control circuit 14, a second bus 15, and a digital-to-analog converter (DAC) 16. Control circuit 14 may include internal multiplexing that ramps up the speed of internal operations on chip so that incoming pixel rates can be reduced, RAM look-up tables, and additional switching circuitry that is common in video drivers. Control circuit 14 provides DAC 16 with a multiple bit code (or "word") that reflects a desired color intensity via bus 15. DAC 16 converts the bit code into an analog voltage that reflects the desired color intensity. In the past, because transfer speeds were slow (<50 Mhz) and control circuitry 14 was simple, high speed data transfers were guaranteed by design and were not tested. As data transfer speeds have increased (75–200 Mhz) and control circuitry 14 has increased greatly in complexity it has become necessary to test the integrity of data transfers.

Data cannot simply be directly ported to an ATE (automated test equipment) at high frequencies because the circuit of FIG. 1 would need additional drivers to drive the high frequency data over an inductive cable to the ATE. Furthermore, an ATE that can read data at high frequencies is much more expensive than low frequency testers.

A common prior art method of testing the integrity of data transfers is to digitize the analog voltage of DAC 16 and compare the digitized voltage value to the expected voltage. This is typically performed by transferring all "0"'s and "1"'s to obtain a black/white color pattern (square wave) at the DAC output. However, this is a slow test to perform and therefore is expensive. Additionally, the resolution of the digitizing technique is not great enough to ensure transfer accuracy to the desired confidence levels. For example, if a least significant bit is getting dropped the error may not be large enough for a voltage error to be detected. Further, even if the error is sufficiently large to detect a failure it is not possible to determine what bit or bits have failed.

A second prior art method is a cyclic redundancy check test (CRC) or a "1's" accumulation method that inputs several bit words into video driver 10 and outputs the words at the output of control circuitry 14. The words are algorithmically combined and compared to the pre-computed expected value. This method is undesirable because although it determines in a YES/NO fashion whether a failure exists, it does not provide any diagnostic capability; it cannot provide information on what specific bit or bits have failed.

It is an object of this invention to provide a test methodology that eliminates the problems of the prior art by quickly and accurately testing high speed data transfers while simultaneously providing appropriate diagnostic information. Other objects and advantages of the invention will become apparent to those of ordinary skill in the art having reference to the following specification together with the drawings herein.

SUMMARY OF THE INVENTION

An undersampling digital testability circuit 20 includes a means for carrying data transfers 15, a data capture array 22 and a divider circuit 18. Divider circuit 18 provides an enable signal to data capture array 22 that undersamples data travelling along the means for carrying data transfers 15 at high data rates thereby effectively testing the integrity of high data rate transfers without the disadvantages of prior art test methodologies.

DETAILED DESCRIPTION OF THE PREFERRED EMBODIMENT

Figure 1:
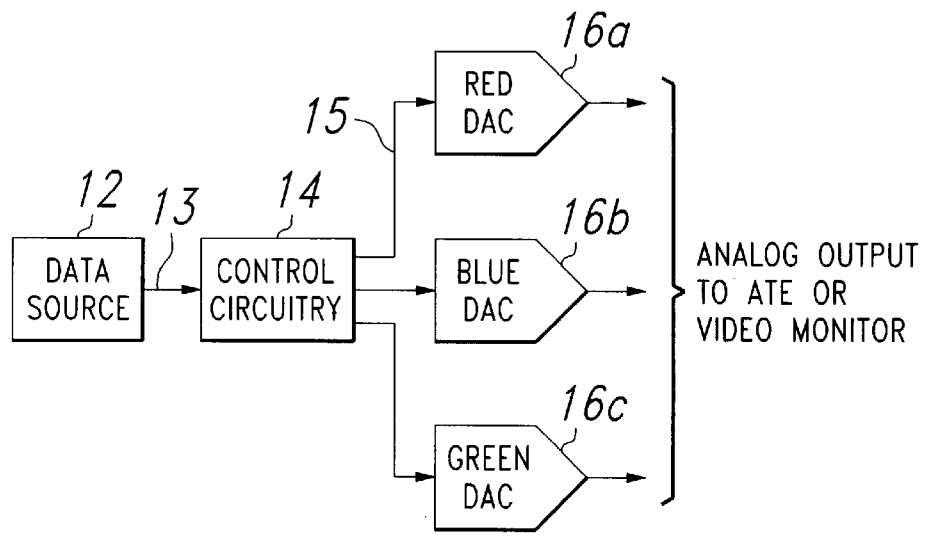
FIG. 1 is a prior art block diagram of a video driver 10.
Figure 2:
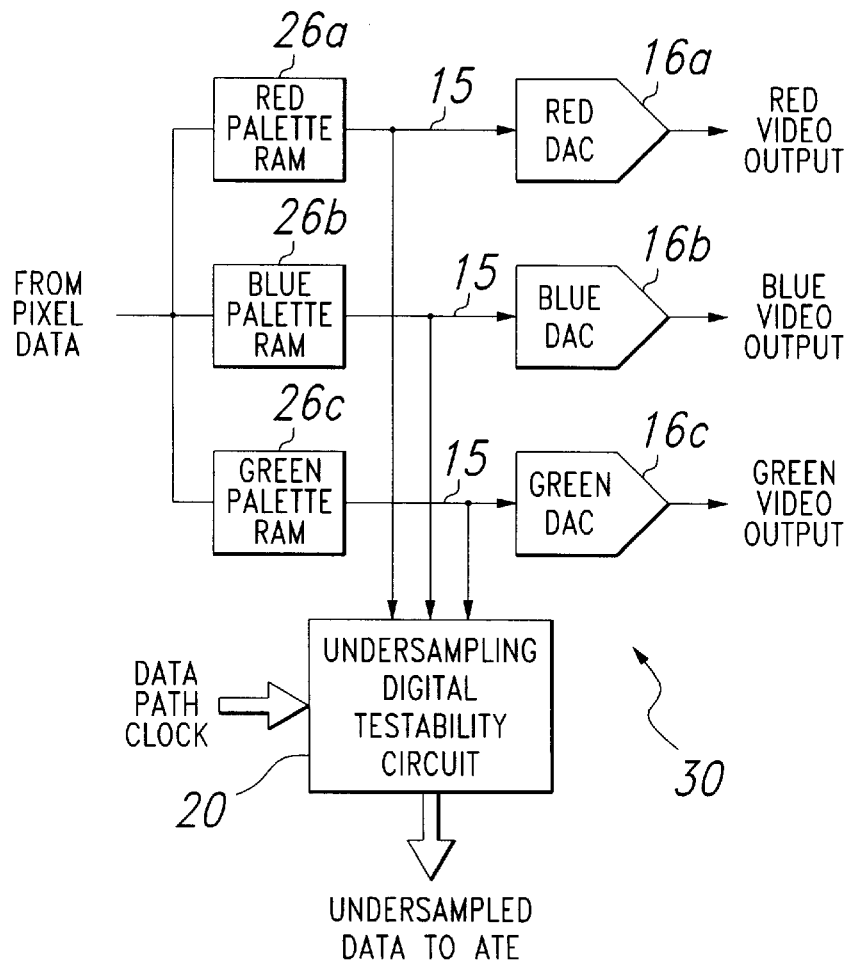
FIG. 2 is a block diagram illustrating the preferred embodiment of the invention, an undersampling digital testability circuit 20 in a video driver circuit 30.

FIG. 2 is a block diagram illustrating the preferred embodiment of the invention, undersampling digital testability circuit 20 in a video driver circuit 30. Video driver circuit 30 consists of three palette RAMs 26a–26c receiving pixel data as inputs. Palette RAMs 26a–26c are connected to DACs 16a–16c via bus 15 and drive a video monitor. Undersampling digital testability circuit 20 acts as a diagnostic port that accesses bus 15. Circuit 20 advantageously tests high speed data transfers without the limitations of prior art data transfer methodologies. Alternatively, bus 15 may be any means for carrying data transfers.

Figure 3:
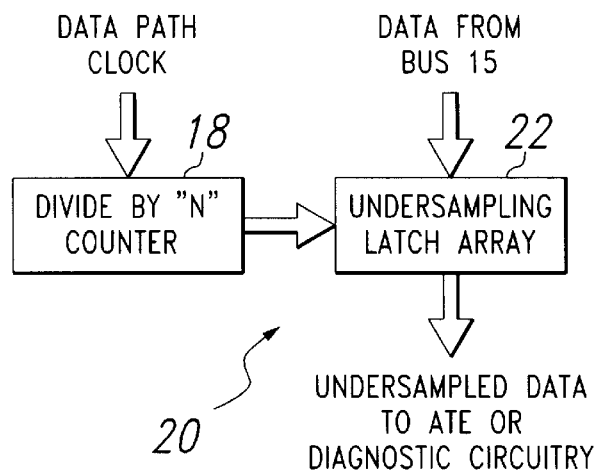
FIG. 3 is a schematic diagram illustrating in greater detail undersampling digital testability circuit 20.

Turning now to FIG. 3, FIG. 3 is a block diagram illustrating in greater detail undersampling digital testability circuit 20. Circuit 20 has data (in this particular embodiment a multiple bit word from one of palette RAMs 26a–26c) coming into an undersampling register array 22. Undersampling register array 22 is also connected to a counter 18. Counter 18 receives as an input a data transfer clock signal that is the same frequency of the high speed data transfer. The output of register array 22 is connected to automated test equipment (ATE) external to video driver circuit 30. It is important to note circuit 20, in this particular embodiment, is integrated onto video driver chip 30. However, circuit 20 could alternatively reside on an external test board.

Figure 4:
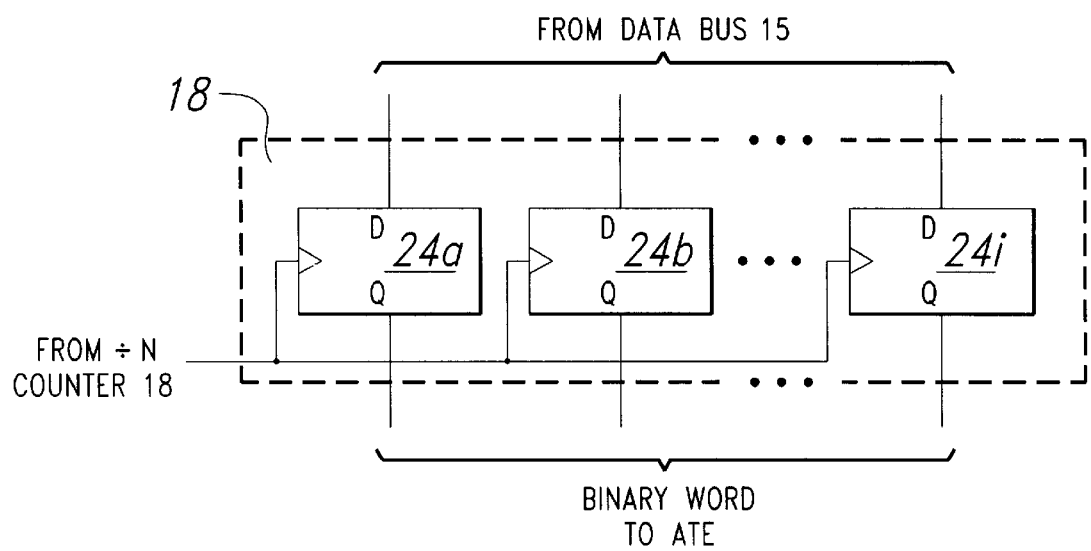
FIG. 4 is a block diagram illustrating an undersampling register array 22.

Now with respect to FIG. 4, FIG. 4 is a schematic diagram illustrating register array 22. Register array 22 has a plurality of D-type flip flops 24a–24i each having a data input connected to bus 15, an enable input connected to counter 18, and an output connected to the ATE. The letter "i" represents the number of flip flops used and corresponds to the number of bits of data to be captured. The ATE takes the data on the output of flip flops 24a–24i and compares it to its expected values to check for errors in the data transfer. In this manner, the ATE can determine whether a data transfer failure occurred and which bit or bits caused the failure. Undersampling digital testability circuit 20 undersamples the data being transferred within video driver circuit 30 and thus the transfer rate of undersampled data to the ATE is substantially slower than the rate of the high speed data transfers within video driver circuit 30.

A functional description of the invention now follows in conjunction with FIGS. 2, 3, and 4. In FIG. 2, pixel data is input to palette RAMs 26a–26c. The pixel data represents an instruction regarding the color and intensity for each individual pixel and is driven by software in test mode. In a test mode the digital test vectors driving video circuit 30 will be from the ATE. Palette RAMs 26a–26c form a look-up table and output a multi-bit code that reflects the desired color and intensity. It should be understood that most colors consist of a combination of varying red, blue, and green colors. Therefore, each desired color and intensity will be represented by three multi-bit codes, each being input to its appropriate DAC 16a–16c. Each DAC 16a–16c receives its respective multi-bit code and converts it into an analog voltage as is well known in digital-to-analog converters. The analog voltages on the output of DACs 16a–16c drive the output, typically a video monitor. The DACs 16a–16c in this embodiment output a current, but drive an external resistance which converts the current to a voltage. Alternatively, DACs 16a–16c may output a voltage directly.

In high performance graphics systems the rate of data transfer can be very high (75–200 Mhz). To test the accuracy of data transfers undersampling digital testability circuit 20 is coupled to bus 15. Circuit 20, when enabled, acts as a diagnostic port and samples the multi-bit codes from palette RAMs 26a–26c and outputs the sampled data to the ATE which checks to see whether the expected data matches the sampled data.

Undersampling digital testability circuit's 20 operation occurs in the following manner. Multi-bit codes (data) from palette RAMs 26a–26c serve as data inputs to undersampling register array 22 of FIG. 3. Register array 22 includes a plurality of D-type flip flops 24a–24i as shown in FIG. 4 where "i" equals the number of data bits input from palette RAMs 26a–26c. For example, if the multi-bit words from palette RAMs 26a–26c are eight bits long there would be eight D-type flip flops in register array 22. Flip flops 24a–24i are enabled via the output signal from counter 18. Note that the output of counter 18 must be synchronized appropriately with register array 22 so that flip flops 24a–24i are not enabled at the same instant that data is changing in flip flops 24a–24i. Therefore, flip flops 24a–24i may be enabled on the falling edge of the output signal of counter 18. Alternatively, the output of counter 18 may be sent through several transmission gates to provide sufficient delay to prohibit an indeterminate state in flip flops 24a–24i. Counter 18 receives as an input a binary signal having a frequency that matches the frequency of the data transfer. Counter 18 outputs a binary signal that represents the frequency of the data transfer clock signal divided by "N" where "N" is an integer. The value for "N" will be described later.

In this particular embodiment, a 48 bit binary sequence is repeatedly transferred through palette RAMs 26a–26c to DACs 16a–16c by ATE software at the rate determined by the data transfer clock rate, each color having four individual eight bit words. A typical bit sequence for a single color may be as follows:

```
10101010  01010101  11111111  00000000
```

This sequence enables one to see whether each bit for each color transfers properly because each bit alternates several times between a "0" and a "1". In this embodiment, register array 22 consists of eight D-type flip flops. Therefore, each time the flip flops 24a–24i are enabled an eight bit word is captured. The value of "N" used to "divide down" the data rate transfer clock is determined by the following relation: N=M*I+1 where M is the number of cycles needed for the bit sequence to repeat and I is any positive integer. If eight bits are captured each time flip flops 24a–24i are enabled and if the bit sequence repeats every 32 bits, then the value of M is 4 (four) because the bit sequence will repeat every four cycles of the data rate transfer clock. If M=4 then N=4*1+1=5 (letting I=1). Therefore N, which represents the integer used to "divide down" the data transfer clock signal is 5 (five). For example, if the data transfer clock signal has a frequency of 85 Mhz the enable signal frequency of flip flops 24a–24i will be 17 Mhz (85/5=17). This also indicates that every fifth 8 bit word will be sampled in the repeating 32 bit sequence. This ensures that each 8 bit word will be sampled and each data transfer (that is occurring at a rate of 85 Mhz) is tested. Table 1 illustrates this clearly. In Table 1 each sampled eight bit word is underlined. Also "J" represents the number of eight bit words that have been transferred. Therefore, in 16 data transfer clock cycles, each eight bit word (that is transferred at 85 Mhz, yet the data rate to the ATE is only 17 Mhz) will have been accurately sampled.

TABLE 1

| Seq.1 | <u>10101010</u> | 01010101 | 11111111 | 00000000 |
|---|---|---|---|---|
| J | 1 | 2 | 3 | 4 |
| Seq.2 | 10101010 | <u>01010101</u> | 11111111 | 00000000 |
| J | 5. | 6 | 7 | 8 |
| Seq.3 | 10101010 | 01010101 | <u>11111111</u> | 00000000 |
| J | 9 | 10 | 11 | 12 |
| Seq.4 | 10101010 | 01010101 | 11111111 | <u>00000000</u> |
| J | 13 | 14 | 15 | <u>16</u> |
| Seq.5 | 10101010 | 01010101 | 11111111 | 00000000 |
| J | 17 | 18 | 19 | 20 |
| Seq.6 | <u>10101010</u> | 01010101 | 11111111 | 00000000 |
| J | 21 | 22 | 23 | 24 |

Therefore, undersampling digital testability circuit 20 samples the repeating 32 bit sequence, thus accurately testing each high speed data transfer.

It should be noted that this test methodology ignores 16 of 20 data transfers in the continuous 32 bit data stream. This means that individual random failures may be missed. However, since each eight bit word is sampled over a period of time (as shown in Table 1) the same probability exists that the random failure will be discovered for a given number of comparisons. Therefore, circuit 20 is effective in catching failures.

The example provided above used the relation N=M*I+1 for undersampling the transferred data. However, circuit 20 is not limited to this undersampling solution. The above relation is desirable only because the sampled words come out in the same sequence in which they were input. This is not necessary. As long M and N are mutually prime numbers, circuit 20 will sample every word once every M*N clock cycles. Since an engineer has control of the values of M and N the engineer will also know the appropriate output sequence of words to expect and can test appropriately.

Undersampling digital testability circuit 20 advantageously overcomes the limitations of prior art. Circuit 20, by operating as a digital test circuit, eliminates the need for digitizing of analog voltage waveforms thus providing a significant decrease in test time from approximately 300 mS per DAC to approximately 1 mS per DAC. Further, circuit 20 provides diagnostic capability by identifying which bit is in error when failures are detected which is a significant advantage over the prior art digitizing solution and the prior art cyclic redundancy check solution which both fail to provide any detailed information regarding which bit or bits failed when failures are detected.

An alternative embodiment of the invention may include the use of a programmable counter instead of counter 18. Programmable counters are well known by those skilled in the art of circuit design, such as the 8253 programmable counter provided by Intel Corp. A programmable counter may "divide down" the data transfer clock signal by varying amounts dependant upon instructions delivered by software. For example, if the data sequence will repeat every fourth clock cycle during a first test and every fifth clock cycle for a second test, the divider may be programmable by the relation N=M*I+1. Therefore, N=5 for the first test and N=6 for the second test. The programmable counter may then be configured appropriately by internal signals which will be driven by software. Programmable counter would preferably be integrated onto video circuit 30, but could be placed externally on a test board if desired. A programmable counter in circuit 20 would allow a test engineer greater flexibility in the design of tests for video circuit 30. A further alternative would be any form of divider type circuit that would effectively produce an output signal that has a frequency that is a sub-multiple of its input signal.

It should also be noted that register array 22 may also be composed of different types of flip flops or various type registers. Even latches could be used in register array 22. Any form of data capturing element would be an effective alternative in circuit 20. Furthermore, circuit 20, although highly effective in testing high speed data transfers in video driver circuit 30, is not limited to this application. Rather, circuit 20 may advantageously be used to test any high speed data transfer such as data transfers in microprocessors or digital signal processors. The invention may also be incorporated at the system level to aid in testing electronic assemblies with remote ATE on diagnostic equipment.

Although the invention has been described with reference to the preferred embodiment herein, this description is not to be construed in a limiting sense. Various modifications of the disclosed embodiment as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A method of testing data transfers, comprising the steps of:

transferring a multiple word data string through at least one circuit element and along a bus to a circuit output;

capturing a first word of the multiple word data string as it travels along the bus;

analyzing the first word's accuracy and communicating a pass or fail indication to a test user;

waiting for the multiple word data string transferring through at least one circuit element to repeat at least one time; and repeating the steps of capturing a word of the multiple word data string, analyzing the word's accuracy, and communicating a pass or fail indication until all the words in the multiple word data string have been tested, whereby each repeating step analyzing a subsequent word's accuracy in the multiple word data string and whereby testing of each word of the multiple word data string is accomplished at a fraction of the frequency of the multiple word data string.

2. The method of claim 1 wherein capturing a first word of the multiple word data string further comprises the steps of:

enabling a latch array at the instant the first word of the multiple word data string is transferring along the bus; and latching the first word of the multiple word data string into the latch array when the latch array is enabled.

3. The method of claim 2 wherein enabling a latch array further comprises the step of dividing down the frequency of a data path clock signal wherein the data path clock signal frequency dictates the speed of the transfer of the multiple word data string into an enable signal wherein the frequency of the enable signal ensures that each word of the multiple word data string gets latched into the array.

4. The method of claim 1 wherein the step of analyzing the first word's accuracy and communicating a pass or fail indication to a test user comprises the steps of:

comparing the first word of the multiple word data string to an expected value;

setting a pass flag if the first word of the multiple word data string matches the expected value; and setting a fail flag if the first word of the multiple word data string does not match the expected value.

5. The method of claim 1 wherein the multiple word data string is repetitive.

\* \* \* \* \*